US008233327B2

United States Patent
Wang

(10) Patent No.: US 8,233,327 B2
(45) Date of Patent: Jul. 31, 2012

(54) METHOD OF PROGRAMMING NONVOLATILE MEMORY DEVICE

(75) Inventor: In Soo Wang, Chungcheongbuk-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 284 days.

(21) Appl. No.: 12/762,902

(22) Filed: Apr. 19, 2010

(65) Prior Publication Data

US 2011/0170360 A1    Jul. 14, 2011

(30) Foreign Application Priority Data

Jan. 14, 2010  (KR) .................. 10-2010-0003480

(51) Int. Cl.
*G11C 16/34* (2006.01)

(52) U.S. Cl. .......... 365/185.22; 365/185.25; 365/185.28
(58) Field of Classification Search ............. 365/185.02
See application file for complete search history.

(56) References Cited

U.S. PATENT DOCUMENTS

| 5,936,890 A * | 8/1999 | Yeom ................. 365/185.22 |
| 6,031,760 A * | 2/2000 | Sakui et al. ........... 365/185.21 |

FOREIGN PATENT DOCUMENTS

KR    1020090000332    1/2009

OTHER PUBLICATIONS

Notice of Allowance issued from Korean Intellectual Property Office on May 31, 2011.

* cited by examiner

*Primary Examiner* — Tan T. Nguyen
(74) *Attorney, Agent, or Firm* — IP & T Group LLP

(57) ABSTRACT

A method of programming a nonvolatile memory device comprises a bit line voltage set-up step of receiving a program command and data to be programmed and setting up a voltage of a selected bit line according to a state of program data; a program step of supplying a program voltage to a word line selected for a program in response to a control signal for setting up the program voltage, supplying a first pass voltage to unselected word lines, and then performing the program; and a program verification step of, in response to a control signal which is subsequent to the control signal for setting up the program voltage and is used to set a verification voltage, performing a program verification operation by supplying the verification voltage to the selected word line.

6 Claims, 4 Drawing Sheets

METHOD OF PROGRAMMING NONVOLATILE MEMORY DEVICE

CROSS-REFERENCE TO RELATED APPLICATION

Priority to Korean patent application number 10-2010-0003480 filed on Jan. 14, 2010, the entire disclosure of which is incorporated by reference herein, is claimed.

BACKGROUND

Exemplary embodiments relate to a method of programming a nonvolatile memory device.

Recently, there has been an increasing demand for nonvolatile memory devices which can be electrically programmed and erased and which do not require the refresh function of rewriting data at specific intervals.

Particularly, there is an increasing demand for nonvolatile memory devices which can be electrically programmed and erased and can retain its data even without the supply of power. To develop high-capacity memory devices capable of storing a large amount of data, a technique for the high integration memory cells is being developed. A typical nonvolatile memory device includes a number of strings each having a number of memory cells coupled to each other in series. Each memory cell array includes a number of the strings.

Each of the strings of the nonvolatile memory device has a structure in which a number of the memory cells are coupled to each other in series between a bit line and a source line. By having such a string structure, the number of contacts of the bit line and the source line and the size of each memory cell can be reduced, thus enabling a high-capacity memory device. However, there is a disadvantage in that with a reduction in the size of the memory cell, the cell current of the memory cell is significantly reduced and so the access speed is also reduced.

For this reason, the nonvolatile memory device compromise for such a speed decrease by storing and reading data in such a way as to program and read data at the same time on a page basis.

To provide a faster data I/O speed, different techniques for reducing the program or read time have been attempted.

BRIEF SUMMARY

Exemplary embodiments relate to a method of programming a nonvolatile memory device, which is capable of reducing the entire program time by reducing the time that it takes to precharge/discharge word lines during a verification operation when a program is performed.

A method of programming a nonvolatile memory device according to an aspect of the present disclosure comprises a bit line voltage set-up step of receiving a program command and data to be programmed and setting up a voltage of a selected bit line according to a state of program data; a program step of supplying a program voltage to a word line selected for a program in response to a control signal for setting up the program voltage, supplying a first pass voltage to unselected word lines, and then performing the program; and a program verification step of, in the state in which the first pass voltage supplied to the unselected word lines has shifted to a second pass voltage in response to a control signal subsequent to the control signal for setting up the program voltage and is used to set a verification voltage, performing a program verification operation by supplying the verification voltage to the selected word line.

The bit line voltage set-up step comprises precharging the selected and unselected bit lines, and discharging the selected bit line or maintaining the selected bit line at the precharge state in response to the state of the data to be programmed into a memory cell coupled to the selected bit line.

The program step comprises supplying the first pass voltage to the selected and unselected word lines, and increasing the voltage of the selected word line from the first pass voltage to the program voltage.

The program verification step further comprises, if a result of the program verification operation does not indicate a pass, performing the program by increasing the program voltage supplied to the selected word line, supplying the increased program voltage to the selected word line, increasing the second pass voltage supplied to the unselected word line to the first pass voltage, and supplying the increased second pass voltage to the unselected word line.

A method of programming a nonvolatile memory device according to another aspect of the present disclosure comprises the steps of providing the nonvolatile memory device, which comprises a memory cell array having memory cells for storing data and coupled to a plurality of word lines and a plurality of bit lines; receiving a program command; precharging the bit lines and discharging a bit line selected for a program or maintaining the selected bit line at the precharge state in response to a state of data to be programmed; supplying a first pass voltage to selected and unselected word lines and performing the program by supplying a program voltage to a word line selected for the program; decreasing the voltages of unselected word lines other than the selected word line to a second pass voltage smaller than the first pass voltage; and performing a program verification operation by supplying a verification voltage to the selected word line.

The step of performing a program verification operation by supplying a verification voltage to the selected word line further comprises, if a result of the program verification operation does not indicate a pass, performing the program by increasing the program voltage supplied to the selected word line, supplying the increased program voltage to the selected word line, increasing the second pass voltage, supplied to the unselected word line to the first pass voltage, and supplying the increased second pass voltage to the unselected word lines.

DESCRIPTION OF EMBODIMENTS

Hereinafter, exemplary embodiments of the present disclosure will be described in detail with reference to the accompanying drawings. The figures are provided to facilitate understanding of the exemplary embodiment by those of ordinary skill in the art.

Figure 1:
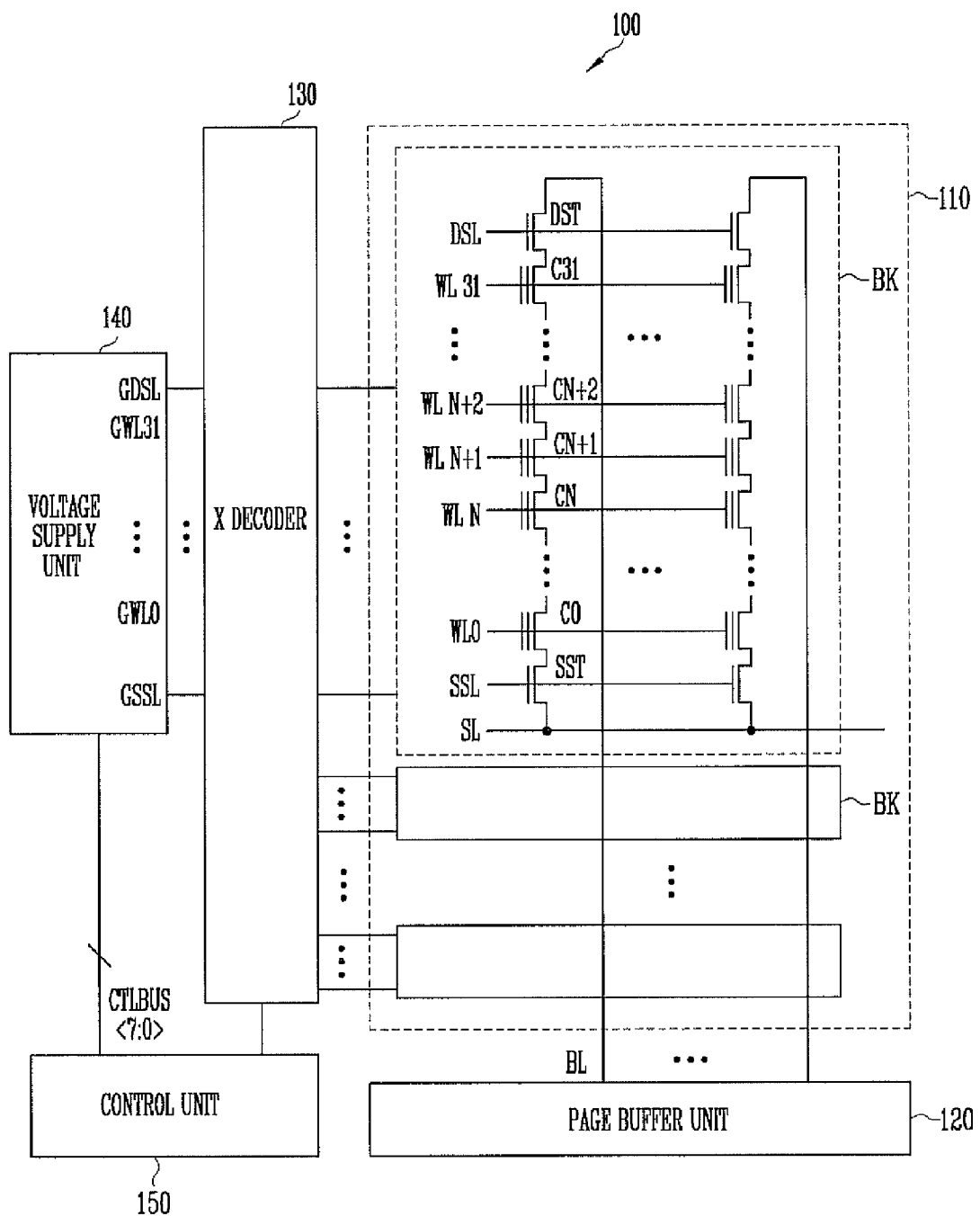
FIG. 1 is a diagram showing a nonvolatile memory device.

FIG. 1 is a diagram showing a nonvolatile memory device. Referring to FIG. 1, the nonvolatile memory device 100 includes a memory cell array 110, a page buffer unit 120, an X decoder 130, a voltage supply unit 140, and a control unit 150.

The memory cell array 110 includes a number of memory blocks BK.

Each of the memory blocks BK includes a number of cell strings. Each of the cell strings includes first to thirty-second memory cells C0 to C31 in series coupled between a source select transistor SST and a drain select transistor DST.

A drain selection line DSL is coupled to the gates of the drain select transistors DST of the cell strings, and a source selection line SSL is coupled to the gates of the source select transistors SST of the cell strings.

First to thirty-second word lines WL0 to WL31 are respectively coupled to the gates of the first to thirty-second memory cells C0 to C31.

The sources of the source select transistors SST are in common coupled to a source line SL. Bit lines BL are respectively coupled to the drains of the drain select transistors DST of the cell strings.

The page buffer unit 120 includes page buffers each coupled to one or more bit lines. The page buffer temporarily stores data to be programmed into a memory cell selected by a specific bit line and a specific word line.

Further, the page buffer reads data stored in a memory cell selected by a specific bit line and a specific word line and stores the read data.

The X decoder 130 enables one of the memory blocks BK in response to control signals generated by the control unit 150. The control unit 150 outputs the control signals to the X decoder 130 based on an address signal received together with an operation command.

The X decoder 130 enables one of the memory blocks BK in response to the control signals generated by the control unit 150. Here, the drain selection line DSL, the source selection line SSL, and the first to thirty-second word lines WL0 to WL31 of the enable memory block BK are respectively coupled to a global drain selection line GDSL, a global source selection line GSSL, and global word lines GWL0 to GWL31.

The voltage supply unit 140 supplies operating voltages to the global drain selection line GDSL, the global source selection line GSSL, and the global word lines GWL0 to GWL31.

The operating voltages generated by the voltage supply unit 140 can include a program voltage, pass voltages, a verification voltage, a read voltage, an erase voltage, and so on.

The control unit 150 outputs the control signals for controlling the operations of the page buffer unit 120, the X decoder 130, and the voltage supply unit 140. The control unit 150 outputs the control signals via, for example, control buses CTLBUS<7:0>.

The control unit 150 according to an embodiment of this disclosure can reduce the time that it takes to perform program and program verification operations by controlling the time that it takes to discharge unselected word lines when a program operation is performed.

Figure 2A:
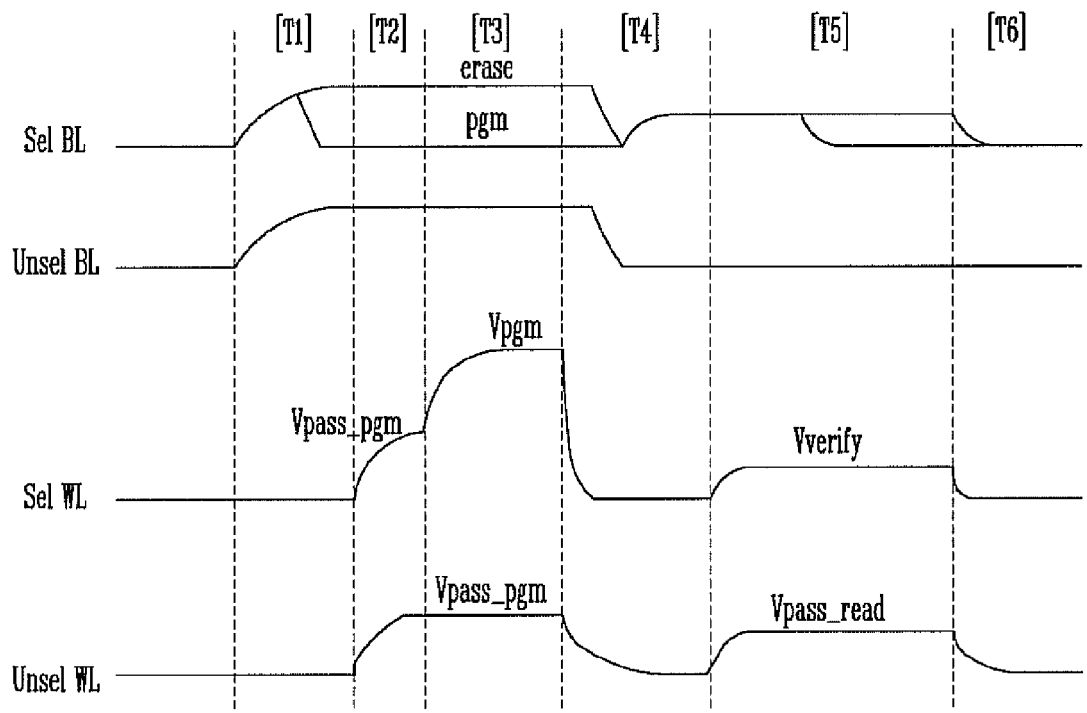
FIG. 2A is a timing diagram illustrating the program operation of a nonvolatile memory device according to an embodiment of this disclosure.
Figure 2B:
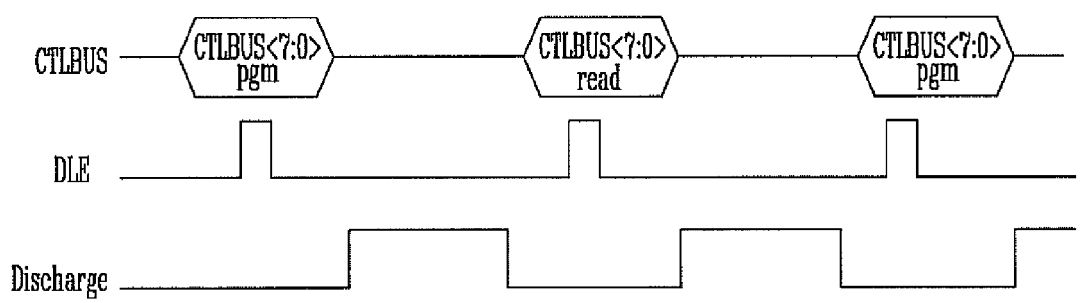
FIG. 2B is a timing diagram illustrating the generation of control signals for the program operation of FIG. 2A.

FIG. 2A is a timing diagram illustrating the program operation of the nonvolatile memory device according to an embodiment of this disclosure. FIG. 2B is a timing diagram illustrating the generation of the control signals for the program operation of FIG. 2A.

The program operation of the nonvolatile memory device is described with reference to FIGS. 1, 2A and 2B.

Referring to FIGS. 2A and 2B, when a program command is inputted to the control unit 150 of the nonvolatile memory device 100, the control unit 150 outputs the control signals for controlling a program operation.

Here, the control unit 150 outputs the control signals for controlling a program voltage and pass voltages to the voltage supply unit 140. The control signals are transferred to the voltage supply unit 140 via the control buses CTLBUS<7:0>. While a data latch enable signal DLE is in a high level, the control signals can be transferred to the voltage supply unit 140 via the control buses CTLBUS<7:0>.

Alternatively, the control signals can be transferred to the voltage supply unit 140 irrespective of the data latch enable signal DLE.

When the program operation is started, all of the bit lines BL are precharged.

A selected bit line Sel BL is maintained at the precharge state or discharged in response to a state of program data stored in a selected page buffer.

The voltage supply unit 140 generates a program voltage Vpgm and pass voltages in response to the control signals received via the control buses CTLBUS<7:0> and outputs the generated program and pass voltages to the global word lines GWL0 to GWL31. Here, the program voltage Vpgm is inputted to a specific global word line coupled to a selected word line Sel WL, and a program pass voltage Vpass_pgm is inputted to the remaining global word lines coupled to the remaining word lines Unsel WL.

Referring to FIG. 2A, during a first period T1, a voltage of the selected bit line Sel BL is at its initial voltage level, and the voltage supply unit 140 starts generating the program voltage Vpgm and the program pass voltage Vpass_pgm.

During a second period T2, the program pass voltage Vpass_pgm is supplied to the word lines Sel WL and Unsel WL.

During a third period T3, the program operation is performed in response to the program voltage Vpgm.

To control the operations during the first to third periods, the control unit 150 outputs the control signals to the voltage supply unit 140. That is, as shown in FIG. 2B, the control signals pertinent to a program voltage 'pgm' are transferred to the voltage supply unit 140 via the control buses CTLBUS<7:0>.

During a fourth period T4, the voltage supply unit 140 discharges voltages of all of the word lines Sel WL and Unsel WL. To this end, the control unit 150 waits for until the voltages of the word lines Sel WL and Unsel WL are discharged. Here, the discharge waiting time may be different for different systems. In FIG. 2A, the fourth period T4 is the discharge waiting time.

During a fifth period T5, the control unit 150 outputs the control signals for a program verification operation through the control buses CTLBUS<7:0>.

In FIG. 2B, the control signals for a read operation are shown because the program verification operation and the read operation are similar to each other in many aspects. The voltage supply unit 140 generates a verification voltage Vverify and a verification pass voltage Vpass_read for the program verification operation in response to the control signals generated by the control unit 150. During the fifth period T5 of FIG. 2A, the program verification operation is performed.

The voltage supply unit 140 supplies the verification voltage Vverify to a global word line coupled to the selected word line Sel WL and the verification pass voltage Vpass_read to the remaining global word lines coupled to the remaining word lines Unsel WL.

In a program operation, the first to fifth periods may be repeatedly performed until a result of the program verification operation is a pass.

Here, operations for discharging voltages supplied to the word lines (during the fourth period) after the program operation but before the program verification operation may significantly increase the time taken for the entire program operation.

According to an exemplary embodiment of this disclosure, the entire program time may be reduced by reducing the time that it takes to discharge the word lines (the fourth period).

Figure 3A:
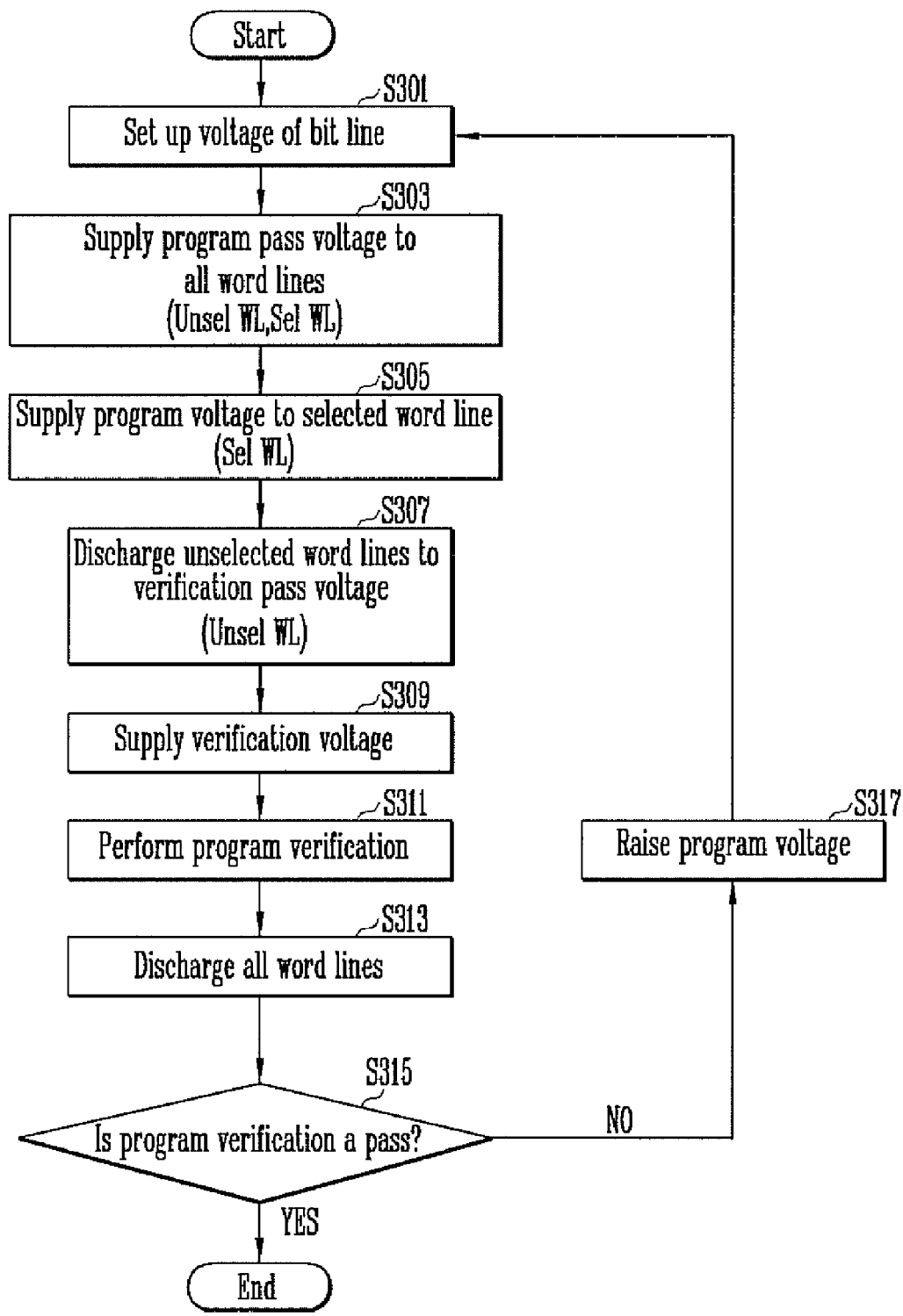
FIG. 3A is a flowchart illustrating a program operation according to an embodiment of this disclosure.
Figure 3B:
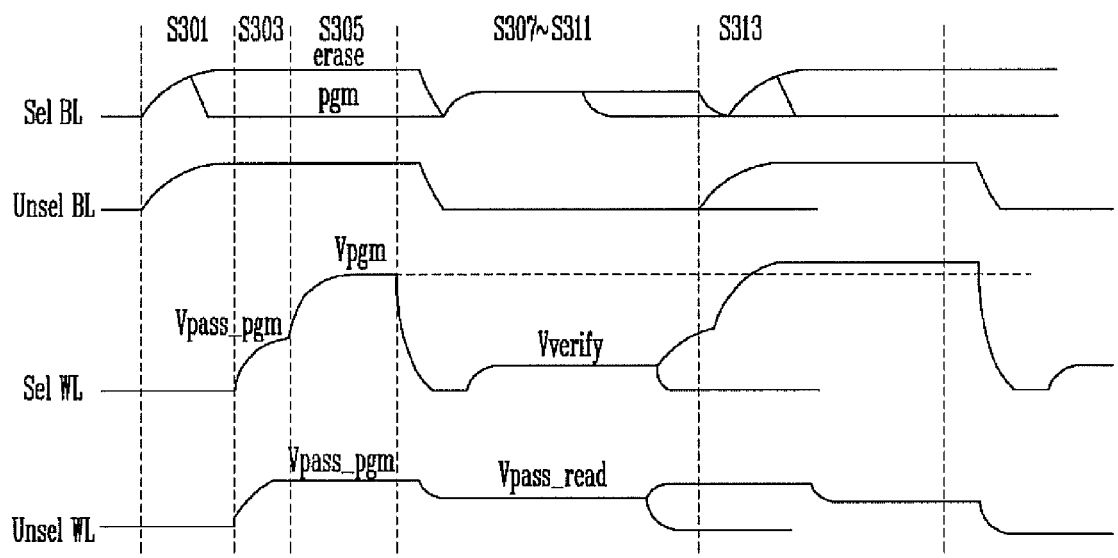
FIG. 3B is a timing diagram showing the program operation of FIG. 3A.
Figure 3C:
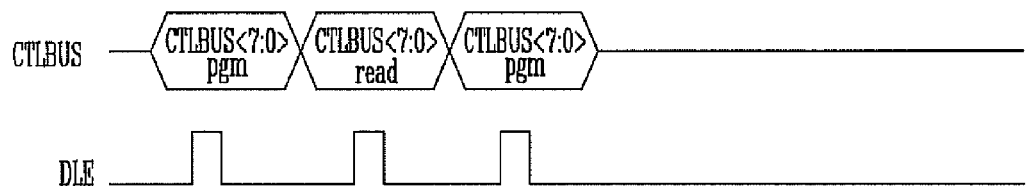
FIG. 3C is a timing diagram illustrating the generation of control signals for the program operation of FIG. 3A.

FIG. 3A is a flowchart illustrating a program operation according to an embodiment of this disclosure. FIG. 3B is a timing diagram illustrating the program operation of FIG. 3A. FIG. 3C is a timing diagram illustrating the generation of control signals for the program operation of FIG. 3A.

Referring to FIG. 3A, to perform a program operation, first, voltages of the bit lines BL are set up at step S301. Here, after the bit lines BL are precharged, the selected bit line Sel BL is maintained at the precharge state or discharged in response to a state of program data.

In the nonvolatile memory device, when a state of the program data is '0', the selected bit line Sel BL is discharged. When a state of the program data is '1', the selected bit line Sel BL maintains the precharge state. Here, the data state '0' represents a program state, and the data state '1' represents an erase state.

To control the program voltage Vpgm, the control unit 150 outputs the control signals (pgm) through the control buses CTLBUS<7:0> in response to the data latch enable signal DLE. The voltage supply unit 140 outputs the program pass voltage Vpass_pgm and the program voltage Vpgm in response to the control signals (pgm) received via the control buses CTLBUS<7:0>.

The control unit 150 also outputs the control signal (read) for a program verification operation, which is consecutive to the control signal for setting up the program voltage Vpgm, through the control buses CTLBUS<7:0>. As described above with reference to FIG. 3C, since the program verification operation and the read operation are similar to each other, an additional verification control signal is not shown, and only the read control signal is shown.

The voltage supply unit 140 supplies the program pass voltage Vpass_pgm to the word lines WL0 to WL31 at step S303. The program voltage Vpgm is supplied to the selected word line Sel WL at step S305, and a program operation is then performed.

Next, the voltage supply unit 140 discharges the unselected word lines Unsel WL to which the program pass voltage Vpass_pgm voltage has been supplied down to the verification pass voltage Vpass_read in response to the control signals (read) received via the control buses CTLBUS<7:0> at step S307. Here, in discharging the unselected word lines Unsel WL down to the verification pass voltage Vpass_read, different methods can be used.

According to an exemplary method, as shown in FIG. 3C, a voltage generator or a voltage pump can be disabled until the program pass voltage Vpass_pgm drops to the verification pass voltage Vpass_read in response to the control signals (read) received via the CTLBUS<7:0> immediately subsequent to the control signals (pgm) received via the CTLBUS<7:0> for controlling the program voltage Vpgm.

Accordingly, the unselected word lines Unsel WL can be discharged without using an additional discharge path.

According to another exemplary method, the program pass voltage Vpass_pgm can be reduced to the verification pass voltage Vpass_read using an additional discharge path. In this case, an additional discharge control signal may be required.

Furthermore, since the selected word line Sel WL is discharged faster than the unselected word lines Unsel WL, the selected word line Sel WL is fully discharged to 0 V during the time for which the voltages of the unselected word lines Unsel WL drop to the verification pass voltage Vpass_read. A difference in the time taken for the selected word line to be discharged and the time taken for the unselected word lines occurs because while only one selected word line Sel WL is discharged, all the other remaining word lines that are unselected are discharged.

After the selected word line Sel WL is discharged to 0V, the voltage supply unit 140 increases the voltage of the selected word line Sel WL to the verification voltage Vverify at step S309, and performs a program verification operation at step S311.

Next, the word lines WL0 to WL31 are discharged at step S313. It is then determined whether a result of the program verification operation is a pass at S315. If, as a result of the determination, the program verification operation is determined to be a pass (that is, indicates a pass), the process is terminated. However, if, as a result of the determination, the program verification operation is determined not to be a pass, the program voltage Vpgm is increased at step S317, and the process returns to step S301.

Here, the voltage of the unselected word lines Unsel WL is increased from the verification pass voltage Vpass_read again and to the program pass voltage Vpass_pgm.

In other words, the voltage of the unselected word lines Unsel WL shifts to the verification pass voltage Vpass_read and then to the program pass voltage Vpass_pgm without being discharged to 0 V until a result of the program verification operation is a pass.

According to another exemplary embodiment of the disclosure, the voltages of the unselected word lines Unsel WL may be fully discharged, if appropriate. According to the first embodiment of this disclosure, however, the voltages of the unselected word lines Unsel WL are not fully discharged until a program is a pass.

As described above with reference to FIG. 3A, the program control signal and the verification control signal are consecutively generated through the control buses CTLBUS. Accordingly, the entire program time can be reduced without requiring an additional discharge time.

As described above, according to an exemplary method of programming the nonvolatile memory device in accordance with the present disclosure, when a program verification operation is performed, the time taken for a pass voltage at unselected word lines to be reduced is decreased by not being fully discharged. Accordingly, the time that it takes to perform the program verification operation can be reduced. Consequently, the time that it takes to perform a program operation can be reduced, and so the performance of a program can be improved.

What is claimed is:

1. A method of programming a nonvolatile memory device, the method comprising:
   a bit line voltage set-up step of receiving a program command and data to be programmed and setting up a voltage of a selected bit line according to a state of program data;
   a program step of supplying a program voltage to a word line selected for a program in response to a control signal for setting up the program voltage, supplying a first pass voltage to unselected word lines, and then performing the program; and
   a program verification step of, in a state in which the first pass voltage supplied to the unselected word lines has shifted to a second pass voltage in response to a control signal subsequent to the control signal for setting up the program voltage and is used to set a verification voltage, performing a program verification operation by supplying the verification voltage to the selected word line.

2. The method of claim 1, wherein the bit line voltage set-up step comprises:
   precharging the selected and unselected bit lines; and
   discharging the selected bit line or maintaining the selected bit line at the precharge state in response to the state of the data to be programmed into a memory cell coupled to the selected bit line.

3. The method of claim 1, wherein the program step comprises:
   supplying the first pass voltage to the selected and unselected word lines; and
   increasing the voltage of the selected word line from the first pass voltage to the program voltage.

4. The method of claim 1, wherein the program verification step further comprises, if a result of the program verification operation does not indicate a pass, performing the program by increasing the program voltage supplied to the selected word line, supplying the increased program voltage to the selected word line, increasing the second pass voltage supplied to the unselected word lines to the first pass voltage, and supplying the increased second pass voltage to the unselected word line.

5. A method of programming a nonvolatile memory device, the method comprising the steps of:
   providing the nonvolatile memory device which comprises a memory cell array having memory cells for storing data and coupled to a plurality of word lines and a plurality of bit lines;
   receiving a program command;
   precharging the bit lines and discharging a bit line selected for a program or maintaining the selected bit line at the precharge state in response to a state of data to be programmed;
   supplying a first pass voltage to selected and unselected word lines and performing the program by supplying a program voltage to a word line selected for the program;
   decreasing the voltages of the unselected word lines to a second pass voltage smaller than the first pass voltage; and
   performing a program verification operation by supplying a verification voltage to the selected word line.

6. The method of claim 5, wherein performing a program verification operation by supplying a verification voltage to the selected word line further comprises, if a result of the program verification operation does not indicate a pass, performing the program by increasing the program voltage supplied to the selected word line, supplying the increased program voltage to the selected word line, increasing the second pass voltage supplied to the unselected word lines to the first pass voltage, and supplying the increased second pass voltage to the unselected word lines.

* * * * *